United States Patent [19]

Tsukada

[11] Patent Number: 5,563,546

[45] Date of Patent: Oct. 8, 1996

[54] SELECTOR CIRCUIT SELECTING AND OUTPUTTING VOLTAGE APPLIED TO ONE OF FIRST AND SECOND TERMINAL IN RESPONSE TO VOLTAGE LEVEL APPLIED TO FIRST TERMINAL

[75] Inventor: Shyuichi Tsukada, Tokyo, Japan

[73] Assignee: NEC Corporation, Tokyo, Japan

[21] Appl. No.: 289,211

[22] Filed: Aug. 12, 1994

[30] Foreign Application Priority Data

Aug. 13, 1993 [JP] Japan ..................... 5-201341

[51] Int. Cl.$^6$ .................................... H03K 17/62
[52] U.S. Cl. .................. 327/408; 365/229; 327/407
[58] Field of Search .................. 326/80, 81, 95; 327/99, 407, 545, 408, 409, 410, 411, 412, 413, 403, 404, 405; 365/229; 307/66

[56] References Cited

U.S. PATENT DOCUMENTS

| | | | |
|---|---|---|---|
| 4,469,959 | 9/1984 | Luke et al. ........................ | 326/81 |
| 4,556,804 | 12/1985 | Dewitt ........................... | 327/434 |
| 4,571,504 | 2/1986 | Iwamoto et al. . | |
| 4,617,473 | 10/1986 | Bingham ......................... | 365/227 |
| 4,694,430 | 9/1987 | Rosier ......................... | 365/189.09 |
| 4,808,844 | 2/1989 | Ozaki et al. ..................... | 327/410 |
| 4,857,773 | 8/1989 | Takata et al. . | |
| 5,157,291 | 10/1992 | Shimoda ......................... | 327/408 |
| 5,187,396 | 2/1993 | Armstrong et al. ................ | 327/407 |
| 5,233,233 | 8/1993 | Inoue et al. ..................... | 324/408 |
| 5,278,798 | 1/1994 | Miyawaki ....................... | 365/229 |

OTHER PUBLICATIONS

Patent Abstracts of Japan, vol. No. 116 (P–125) [994] 29, Jun. 1982.

Primary Examiner—Timothy P. Callahan
Assistant Examiner—Jung Ho Kim
Attorney, Agent, or Firm—Sughrue, Mion, Zinn, Macpeak & Seas

[57] ABSTRACT

A selector circuit is disclosed for a semiconductor memory circuit having a power circuit producing an internal power voltage lower than an external power voltage and including a reference voltage generator generating a reference voltage and a voltage source circuit responding to the reference voltage and supplying the internal power voltage to a memory cell array. The selector circuit includes a first input node connected to receive the reference voltage, a second input node connected to a terminal pad and an output line connected to the voltage source circuit, the terminal pad being supplied with a test voltage in a test mode of the memory circuit and brought into an open state in a normal operation mode of the memory circuit. The selector circuit responds the voltage at the second input node and forms an electrical path between the first input node and the output line in the test mode and between the second input node and the output line in the normal operation mode.

7 Claims, 4 Drawing Sheets

SELECTOR CIRCUIT SELECTING AND OUTPUTTING VOLTAGE APPLIED TO ONE OF FIRST AND SECOND TERMINAL IN RESPONSE TO VOLTAGE LEVEL APPLIED TO FIRST TERMINAL

BACKGROUND OF THE INVENTION

The present invention relates to a selector circuit employed in a semiconductor integrated circuit device and, more particularly, to a selector circuit employed in a semiconductor memory device having a power circuit responding to an external power supply voltage applied to the device and generating an internal power voltage lower than the external power supply voltage.

The increase in memory capacity of a semiconductor memory device has been accelerated more and more. In accordance with the increase in the memory capacity, an internal circuit of the memory deice is required to operate on a voltage lower than an external power supply voltage applied to the device in order to lower power consumption and enhance reliability thereof. For this purpose, the recent memory device incorporates therein a power circuit which responds to the external power supply voltage and generates an internal power voltage lower than the external power supply voltage.

The power circuit incorporated into the memory device is in turn required to generate the internal power voltage stabilized against the variation of the external power supply voltage. For this purpose, the power circuit includes a reference voltage generator generating a reference voltage by utilizing threshold voltages of MOS transistors. Although the threshold voltage of the MOS transistor is stabilized against the variation of the external power supply voltage, it is influenced by the manufacturing process of the transistor and thus deviated from the designed value. Accordingly, the power circuit further includes a voltage regulator coupled to the reference voltage generator to regulate the reference voltage therefrom.

Referring to FIG. 1, a reference voltage generator 40 according to the prior art employed in a power circuit of a memory device includes a reference circuit 39 and a voltage regulator 30. The reference circuit 39 generates a reference voltage by utilizing the threshold voltages of MOS transistors (not shown), as described above, and supplies it to an input node 32 of the regulator 30 which includes an operational amplifier 31, a P-channel MOS transistor Q5 and resistors R2 and R3 connected as shown. As each of the resistors R2 and R3 is denoted as a variable resistor in FIG. 1, accordingly, a regulated reference voltage is derived from an output node 33 of the regulator 30 by adjusting the resistance values of the resistors R2 and/or R3.

It is of course impossible to form the variable resistor on the semiconductor chip. Accordingly, each of the resistors R2 and R3 is in fact constructed by a plurality of unit resistors and fuses each connected in parallel to an associated one of the unit resistors. The selected one or ones of the fuses are blown to adjust the resistance value of each of the resistors R2 and R3. Blowing a fuse is carried out by a raiser trimming apparatus, as is well known in the art. In order to select the fuses to be blown and determine the number thereof, the voltage from the output node 33 is required to be measured. For this purpose, the generator 40 further includes a voltage measurement circuit 38. This circuit 38 includes a comparator 35 having a non-inverting input terminal connected to the output node 33 of the regulator 30, an inverting input terminal connected to a terminal pad P1 and an output terminal connected to another terminal pad P2, each of pads P1 and P2 being formed on the semiconductor chip. The comparator 35 is activated in a test mode. In the test mode, accordingly, the pad P1 is supplied with a variable reference test voltage from a test apparatus. The potential level of the test voltage applied to the Pad P1, at which the level at the pad P2 is inverted from the high level to the low level, represents the reference voltage which is not yet properly regulated. From that potential level, the deviation from the desired potential level of the reference voltage is obtained. One or more fuses are then blown by the trimming apparatus by use of the deviation thus obtained. The voltage regulator 30 thus generates the regulated and desired reference voltage at the output node 33 in a normal operation mode.

As is well known in the art, the memory device includes in general a memory cell array having a plurality of memory cells and further includes a redundant memory cell array including a plurality of redundant memory cells for defective memory cells. The defective memory cell or cells in the memory cell array are thus replaced with one or more redundant memory cells in the redundant memory cell array. Specifically, when a set of address signals designating the defective memory cell is supplied to the device, the redundant memory cell array is selected in place of the memory cell array having the defective memory cell, and data is written into or read form the selected redundant memory cell. In order to replace the defective memory cell with the redundant memory cell, the address designating the defective memory cell has to be memorized. For this purpose, a fuse circuit is employed to memorize that address, as is also well known in the art. The fuse circuit includes a plurality of fuses, and selected one or ones thereof are blown by the trimming apparatus to store the defective address.

Thus, it is required to blow the selected fuse or fuses in the voltage regulator 30 as well as those in the fuse circuit for the defective address. It is needless to say that it is desirable to blow all the selected fuses at one time. However, it is impossible for the memory device having the reference voltage generator 40 to do that. Blowing the selected fuses in the regulator 30 and blowing those in the fuse circuit for the defective address has to be done in separated steps.

Specifically, the defective memory cell or cells are detected under the condition of supplying the desired internal power voltage to the memory cells. In order to supply the desired internal power voltage, the regulated reference voltage is required. For this reason, the selected fuses in the regulator 30 is first blown to generate the regulated reference voltage. As a result, the selected fuses for memorizing the defective address is blown after blowing the fuse or fuses in the regulator 30.

Therefore, it has been proposed to connect the terminal pad P1 directly to the output node 33 of the regulator 30, as shown in FIG. 2. In this circuit, the reference voltage at the output node 33 is first measured from the pad P1 to detect the deviation from the desired potential level and the desired reference voltage is then supplied from the pad P1 to the output node 33 to bring the memory cell array into a condition of receiving a desired internal power voltage to detect the defective cell or cells. The information necessary to blow fuses to be blown is thus derived, so that all the selected fuses can be blown at one time.

However, the voltage regulator 30 has a very high output impedance, as is apparent from the circuit construction thereof. For this reason, the potential level at the pad P1 easily fluctuates even by slight noises. The accurate potential level at the pad P1 is thus not derived. Moreover, the test apparatus is required to measure the potential level at the pad P1 and then supply the desired reference potential level to the pad P1. That is, the test apparatus needs two functions different from each other for the same pad P1. The cost of the test apparatus is thereby increased accordingly.

SUMMARY OF THE INVENTION

It is therefore an object of the present invention to provide a selector circuit suitable for being employed in a reference voltage generator of a power circuit for a semiconductor memory device.

It is another object of the present invention is to provide a selector circuit selecting one of two input voltages without requiring a selection control signal.

A selector circuit according to the present invention comprises a first input terminal, a second input terminal, an output terminal, a first switching circuit coupled between the first input terminal and the output terminal, a second switching circuit coupled between the second input terminal and the output terminal, and a control circuit coupled to the first input terminal and rendering the first switching circuit conductive to select and coupled the first input terminal to the output terminal when a voltage supplied to the first input terminal is lower than a predetermined potential level and rendering the second switching circuit conductive to select and coupling the second terminal to the output terminal when the voltage equal or higher than the predetermined potential level.

The selector circuit thus constructed requires therefore no selection control signal. Only by the voltage supplied to the first input terminal, the selection of the first input terminal or second input terminal is performed. Accordingly, this selector circuit can be employed for a reference voltage circuit of a power circuit of a semiconductor memory device, in which the output voltage of a voltage regulator for regulating a reference voltage from a reference circuit is supplied to the second terminal of the selector and a test voltage from a test apparatus is supplied to the first input terminal thereof.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 3:
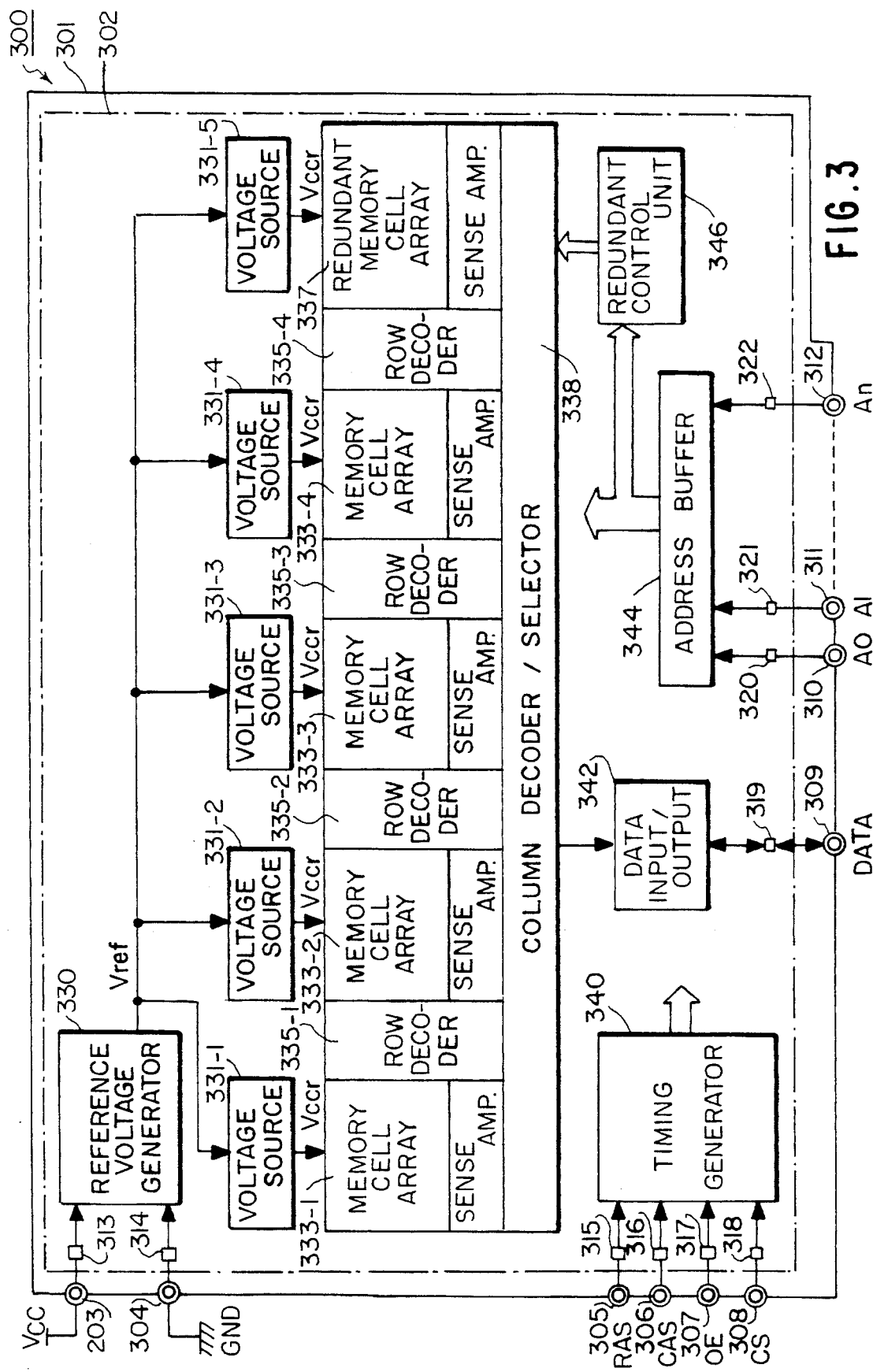
FIG. 3 is block diagram illustrative of a semiconductor memory device having a reference voltage generator employing a selector circuit according to an embodiment of the present invention.

Referring to FIG. 3, a semiconductor memory device 300 as a dynamic random access memory (DRAM) includes a reference voltage generator 330 employing a selector circuit (not shown in the drawing) according to an embodiment of the present invention. This memory device 300 is fabricated as an integrated circuit device and thus has a package 301 and a semiconductor chip 302 encapsulated in the package 301. The package includes a power supply terminal pin 303 applied with an external power voltage Vcc, a ground terminal pin 304, and control signal input terminal pins 305–308 supplied respectively with a row address strobe signal RAS, a column address strobe signal CAS, an output-enable signal OE and a chip-select signal CS. Further included in the package 301 are a data input/output terminal pin 309 for a data signal DATA and a plurality of address input terminal pins 310–312 supplied with a set of address signals Ao–An.

The semiconductor memory chip 302 includes terminal pads 313–322 correspondingly to the terminal pins 303–312. The control signal RAS, CAS, OE and CS are supplied to a timing generator 340 which in turn generates a plurality of internal timing signals. In response thereto and further to the address signals from an address buffer 344, one of memory cells in memory cell array blocks 333-1 to 333-4 is selected by row decoders 335 and a column decoder/selector 338. A data read/write operation on the selected memory cell is performed through a data input/output buffer 342. The memory further includes a redundant memory cell array 337 including a plurality of redundant memory cells provided for being selected in place of the defective memory cells in the arrays 333. As mentioned before, the address information designating the defective memory cell is stored in a redundant control unit 346. Further detailed description will be omitted, because the circuit construction and operation of the memory are themselves well known in the art. However, there are further provided five voltage sources 331-1 to 331-5, each of which responds to a reference voltage Vref from the generator 330 and supplies the associated memory cell array 333 or 337 with an internal power voltage Vccr that takes the same potential level as the reference voltage Vref. Each of the voltage sources 331 has a driving capability sufficient to drive the associated memory cell array 333.

Figure 1:
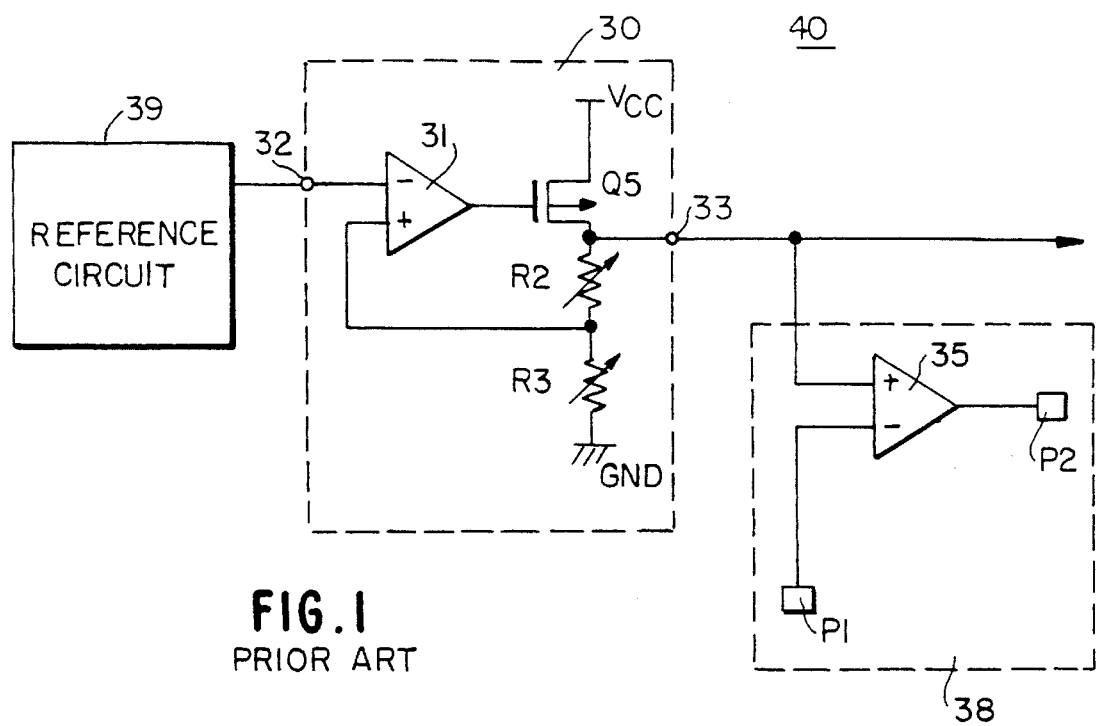
FIG. 1 is a circuit diagram illustrative of a reference voltage generator according to a prior art.
Figure 2:
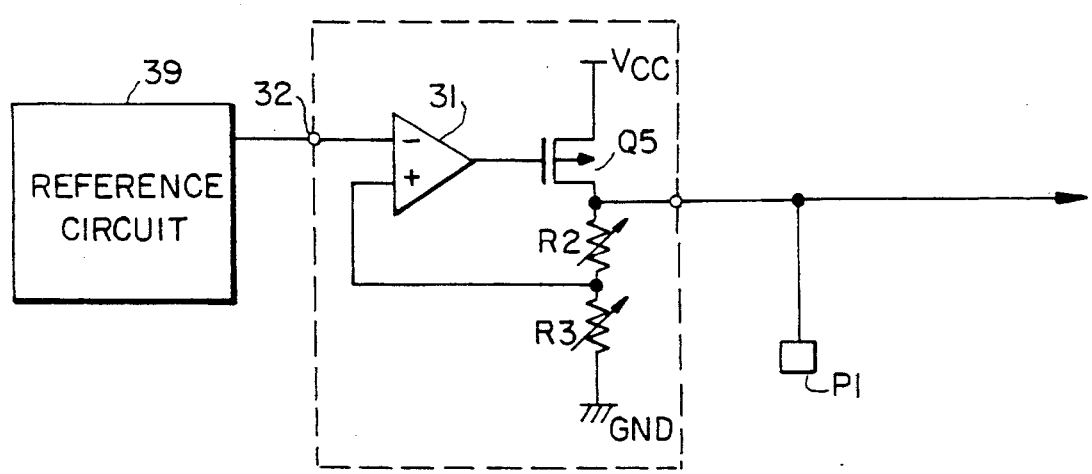
FIG. 2 is a circuit diagram illustrative of another prior art.
Figure 4:
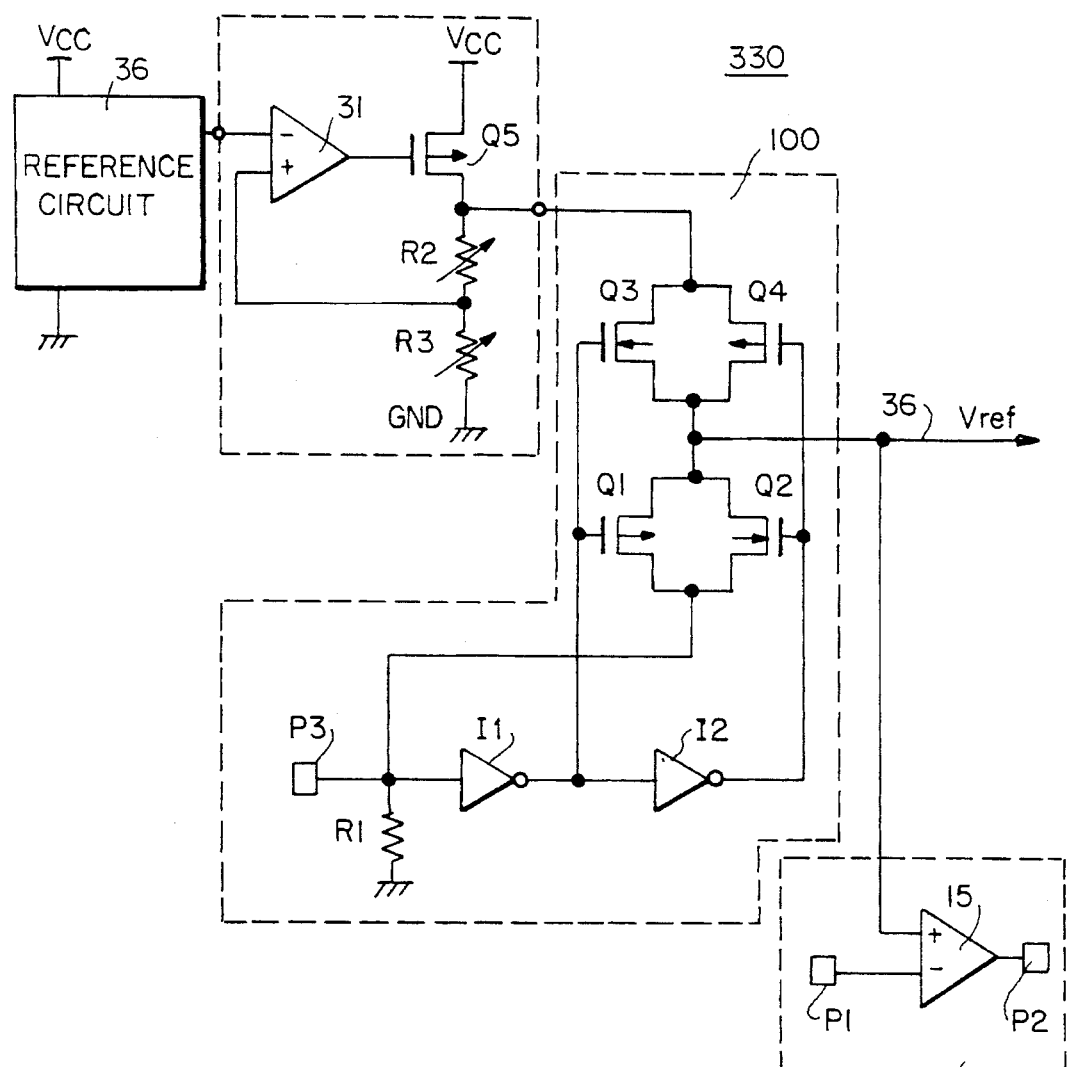
FIG. 4 is a circuit diagram illustrative of the reference voltage generator employing the selector circuit shown in FIG. 3.

Turning to FIG. 4, there is shown a circuit diagram of the reference voltage generator 330, in which the same constituents as those shown in FIG. 1 are denoted by the same reference numerals to omit the further description thereof. In this generator 330, there is provided a selector circuit 100 according to the embodiment of the present invention. This circuit 100 includes an N-channel MOS transistor Q3 and a P-channel MOS transistor Q4 connected in parallel to each other between the output node 33 of the voltage regulator 30 and a line 36 from which the reference voltage Vref is derived, and a P-channel MOS transistor Q1 and an N-channel MOS transistor Q2 connected in parallel to each other between the line 36 and a terminal pad P3 formed on the chip 302. The terminal pad P3 is in turn connected to the ground line GND through a resistor R1 and further to the input node of an inverter I1 having its output node connected in common to the gates of the transistors Q1 and Q3. The output node of the inverter I1 is further connected to the input node of an inverter I2 having its output node connected in common to the gates of the transistors Q2 and Q4. Each of the inverters I1 and I2 operates on the external power supply voltage Vcc.

After the semiconductor memory device 300 having the selector circuit 100 in the reference voltage generator 330 is produced, it is brought into a test mode to measure the potential level of the reference voltage Vref and detect the defective memory cells in the arrays 331. In this test mode, the terminal pad P3 is first supplied with the low (ground) level by a test apparatus (not shown). The transistors Q3 and Q4 are thereby turned ON to transfer the output voltage of the regulator 30 to the line 36. At this time, the comparator 35 is in the active state, and hence the test apparatus supplies the terminal pad P2 with a variable test reference voltage. From the test reference voltage at which the output of the comparator 35 at the terminal pad P2 is inverted from the high level to the low level, the information indicative of the deviation of the reference voltage Vref from the desired or designed potential level is derived and temporarily stored in the test apparatus.

The test apparatus then applies the designed reference voltage to the terminal pad P3. The threshold level of the inverter I1 is designed to have an intermediate level between the reference voltage and the ground level. In the present embodiment, the designed reference voltage Vref, i.e, the internal power voltage Vccr is 2 V and the threshold level of the inverter I1 is 1V. The external power supply voltage Vcc is 3.3 V. Accordingly, the inverter I1 outputs the low (Vcc) level, so that the transistors Q1 and Q2 are rendered conductive. The reference voltage is thereby transferred on to the line 36 through the transistors Q1 and Q2. Thus, the memory cell circuit on the chip is supplied with the internal power voltage. Under this condition, the test for detecting defective memory cells is performed, so that information indicative of an address of addresses designating the defective memory cell or cells is derived and temporarily stored in the test apparatus.

The memory device 300 is then transferred to a trimming apparatus together with the information indicative of the reference voltage regulation data and the defective addresses. Thus, all selected ones of fuses (not shown) in the regulator 30 and the redundant control unit 346 are blown at one time.

In a normal operation, the terminal pad P3 is in an open state; however, the pad P3 is connected to the ground line by the resistor R1. Accordingly, the inverter I1 receives the low level to render the transistors Q3 and Q4 conductive and those Q1 and Q2 non-conductive. The regulated reference voltage Vref is thus derived from the line 36 and the desired internal power voltage Vccr is applied to the memory circuit in the normal operation mode.

Figure 5:
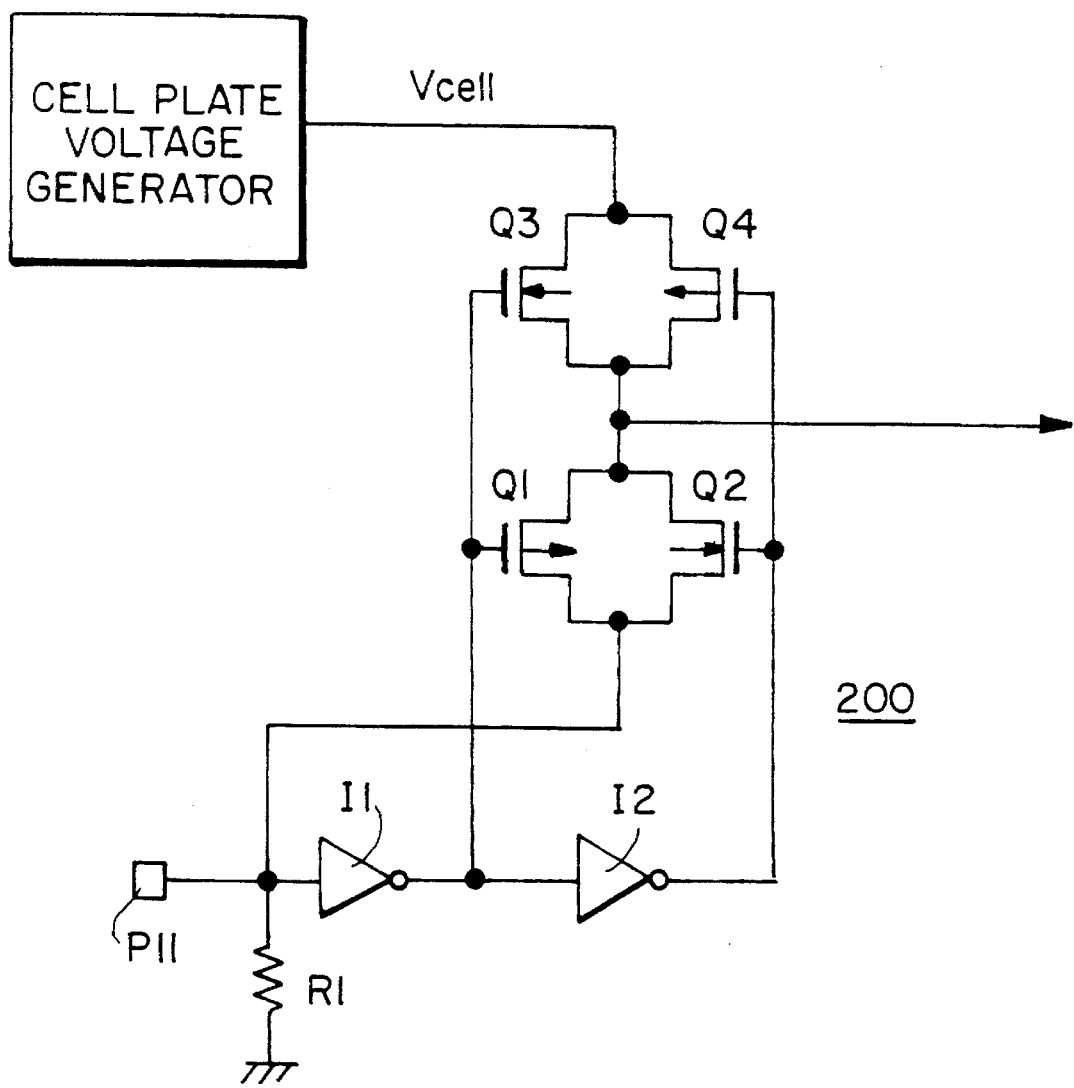
FIG. 5 is a circuit diagram illustrative of a part of another semiconductor memory employing the selector circuit shown in FIG. 4.

As one of the tests for the DRAM cells of one-transistor and one-capacitor type, there is a data holding characteristic. This test is carried out by changing the potential level applied to the common electrode or cell plate of each capacitor of the cell. Such a circuit construction is thus required that supplies the cell plate of each memory cell with a variable voltage. For this purpose, as shown in FIG. 5 as another application of the present invention, a selector circuit 200 having the same circuit construction as the circuit 100 shown in FIG. 4 receives the cell plate voltage Vcell from a cell plate voltage generator 20 at the common node of the transistors Q3 and Q4. The cell plate voltage Vcell is designed to have a half level of the internal power voltage Vccr. On the other hand, the common node of the transistors Q1 and Q2 is connected to a terminal pad P11. In the data holding test mode, the pad P11 is supplied with a test cell plate voltage higher than the threshold level of the inverter I1, so that the cell plate of each memory cell is supplied with the test voltage through an output node of the circuit 200. In the normal operation, the pad P11 is grounded through the resistor R1, and hence the cell plate voltage Vcell is supplied to the cell plate of each memory cell.

It is apparent that the present invention is not limited to the above embodiment but may be modified and changed without departing from the scope and spirit of the present invention.

What is claimed is:

1. A selector circuit comprising:

a first input terminal, a second input terminal, an output terminal, a first switching circuit coupled between said first input terminal and said output terminal, a second switching circuit coupled between said second input terminal and said output terminal, and a control circuit which is coupled to said second input terminal, and which (1) renders said first switching circuit conductive when a voltage at said second input terminal is smaller than a threshold voltage, and (2) renders said second switching circuit conductive when said voltage at said second input terminal is equal to or greater than said threshold voltage;

wherein said first switching circuit includes a first transistor of a first channel type and a second transistor of a second channel type connected in parallel to each other, said second switching circuit includes a third transistor of said first channel type and a fourth transistor of said second channel type connected in parallel to each other, said control circuit includes (1) a first inverter having an input node coupled to said second input terminal and an output node coupled to gates of said first and fourth transistors, and (2) a second inverter having an input node coupled to said output node of said first inverter and an output node coupled to gates of said second and third transistors, and said threshold voltage is (1) a voltage equal to a threshold level of said first inverter, and (2) is independent of a voltage at said first input terminal; and wherein a voltage at said output terminal is selected by said selector circuit to be one of said voltage at said first input terminal and said voltage at said second input terminal depending on said voltage at said second input terminal.

2. The circuit as claimed in claim 1, wherein:

said second input terminal is supplied with a reference voltage, and said threshold voltage is smaller than said reference voltage.

3. The circuit as claimed in claim 2, wherein said second input terminal is connected through an impedance element to a potential line receiving a potential level that is smaller than said reference voltage.

4. The circuit as claimed in claim 1, wherein said second input terminal is coupled to a reference potential line through a resistor.

5. For a semiconductor circuit having (1) a voltage generator generating a predetermined voltage at an output node, and (2) a terminal pad which is supplied with a test voltage when said semiconductor circuit is in a test mode and which is in an open state when said semiconductor circuit is in a normal operation mode, a selector circuit comprising:

a first input node connected to the output node of said voltage generator, a second input node connected to said terminal pad, an output line, a first transfer gate coupled between said first input node and said output line, a second transfer gate coupled between said second input node and said output line, and a control gate coupled to said second input node, and (1) rendering said first gate conductive when said terminal pad is in said open state, and (2) rendering said second transfer gate conductive when said terminal pad is supplied with said test voltage;

wherein said control gate includes a gate circuit which has a threshold level that is smaller than said test voltage, said threshold level is independent of said predetermined voltage at said first input node, said second input node is connected to a reference potential line through an impedance element, and said second input node is supplied with a potential level on said reference potential line when said terminal pad is in said open state;

wherein a level at said output node is selected only by controlling a level at said second input node.

6. A selector circuit for a semiconductor memory circuit having a memory cell array including a plurality of memory cells, an address circuit for selecting at least one of said memory cells in response to address information, a data read/write circuit for performing a data read/write operation on a selected memory cell, and a power circuit generating and supplying an internal power voltage to said memory cell array, said power circuit including a reference voltage generator generating at an output node a reference voltage and a voltage source circuit responding to said reference voltage and supplying said internal power voltage to said memory cell array, said selector circuit comprising:

a first input node coupled to the output node of said reference voltage generator and a second input node coupled to a terminal pad, an impedance element coupled between said second input node and ground line, said terminal pad being supplied with a test voltage when said semiconductor memory circuit operates in a test mode and brought into a floating state when said semiconductor memory circuit operates in a normal mode so that said second input terminal is supplied with said test voltage in said test mode and with a ground voltage on said ground line in said normal mode, an output line coupled to said voltage source circuit, and circuit means responsive to a voltage at said second input node for forming (1) a first electrical path between said first input node and said output line in said normal mode, and (2) a second electrical path between said second input node and said output line in said test mode;

wherein said circuit means includes a gate circuit (1) having a threshold level that is intermediate between said ground voltage and said test voltage, (2) causing a formation of said first electrical path when the voltage at said second input node does not exceed said threshold voltage, and causing a formation of said second electrical path when the voltage at said second input node exceeds said threshold voltage.

7. The circuit as claimed in claim 6, wherein said gate circuit comprises an inverter.

* * * * *